(12) United States Patent
Fukazawa

(10) Patent No.: US 9,396,956 B1
(45) Date of Patent: Jul. 19, 2016

(54) METHOD OF PLASMA-ENHANCED ATOMIC LAYER ETCHING

(71) Applicant: ASM IP Holding B.V., Almere (NL)

(72) Inventor: Atsuki Fukazawa, Tama (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/598,532

(22) Filed: Jan. 16, 2015

(51) Int. Cl.
*H01L 21/3065* (2006.01)
*H01L 21/311* (2006.01)
*H01J 37/32* (2006.01)
*H01L 21/3213* (2006.01)
*H01L 21/67* (2006.01)

(52) U.S. Cl.
CPC ....... *H01L 21/3065* (2013.01); *H01J 37/32146* (2013.01); *H01J 37/32449* (2013.01); *H01L 21/31111* (2013.01); *H01L 21/31116* (2013.01); *H01L 21/32136* (2013.01); *H01L 21/32137* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 4,756,794 A | 7/1988 | Yoder | |
| 7,416,989 B1 | 8/2008 | Liu et al. | |
| 7,494,882 B2 | 2/2009 | Vitale | |
| 7,955,516 B2 * | 6/2011 | Chandrachood | B82Y 10/00 216/67 |
| 8,043,972 B1 | 10/2011 | Liu et al. | |
| 8,617,411 B2 | 12/2013 | Singh | |
| 8,633,115 B2 | 1/2014 | Chang et al. | |
| 2011/0027999 A1 | 2/2011 | Sparks et al. | |
| 2011/0139748 A1 | 6/2011 | Donnelly et al. | |
| 2011/0192820 A1 | 8/2011 | Yeom et al. | |
| 2013/0168354 A1* | 7/2013 | Kanarik | H01J 37/32082 216/68 |

FOREIGN PATENT DOCUMENTS

WO     2004008827 A2     1/2004

OTHER PUBLICATIONS

S.D. Athavale and D.J. Economou, "Realization of Atomic Layer Etching of Silicon", Journal of Vacuum Science and Technology B, vol. 14, year 1996, pp. 3702-3705.*

H.J. Yun et al., "Comparison of Atomic Scale Etching of Poly-Si in Inductively Coupled Ar and He Plasmas", Korean Journal of Chemical Engineering, vol. 24, year 2007, pp. 670-673.*

* cited by examiner

*Primary Examiner* — Jiong-Ping Lu
(74) *Attorney, Agent, or Firm* — Snell & Wilmer LLP (57) ABSTRACT

A method for etching a layer on a substrate includes at least one etching cycle, wherein an etching cycle includes: continuously providing an inert gas into the reaction space; providing a pulse of an etching gas into the continuous inert gas flow upstream of the reaction space to chemisorb the etching gas in an unexcited state on a surface of the substrate; and providing a pulse of RF power discharge between electrodes to generate a reactive species of the inert gas in the reaction space so that the layer on the substrate is etched.

16 Claims, 3 Drawing Sheets

| Parameter | Feed 0.3 s | Purge 1 1 s | RF 1 s | Purge 2 0.2 s |
|---|---|---|---|---|
| Etching gas | | | | |
| Carrier gas | | | | |
| Reactant gas | | | | |
| RF | | | | |

| Parameter | Feed 0.3 s | Purge 1 1 s | RF 1 s | Purge 2 0.2 s |
|---|---|---|---|---|
| Etching gas | ▓▓ | | | |
| Carrier gas | ──── | ──── | ──── | ──── |
| Reactant gas | ──── | ──── | ──── | ──── |
| RF | | | ──── | |

Fig. 3

| Parameter | Set Gas 10 s | Stabilize 10 s | Etching 10-30 s | Off 1 s |
|---|---|---|---|---|
| Etching gas | ▓──── | ──── | ────▓ | |
| Dilution gas | ──── | ──── | ──── | ──── |
| Oxygen gas | ──── | ──── | ──── | ──── |
| RF | | | ──── | |

METHOD OF PLASMA-ENHANCED ATOMIC LAYER ETCHING

BACKGROUND OF THE INVENTION

1. Field of the Invention

The present invention generally relates to a method of atomic layer etching (ALE), particularly to a method of plasma-enhanced ALE (PEALE).

2. Description of the Related Art

In order to cope with various processing accompanying microminiaturization and complex structures of semiconductor devices, precision of processing has been remarkably improved by new technology such as double-patterning. However, conventional etching technology such as continuous etching using excited reaction species may be difficult to form fine, narrow convex-concave patterns and may cause defects of shape. Thus, development of etching technology which is capable of performing atomic layer-level etching and is suitable for e.g., double-patterning processes, becomes important. However, low etching rate, poor controllability over directionality of etching, or the like need to be improved.

Any discussion of problems and solutions in relation to the related art has been included in this disclosure solely for the purposes of providing a context for the present invention, and should not be taken as an admission that any or all of the discussion was known at the time the invention was made.

SUMMARY OF THE INVENTION

Some embodiments provide a method of atomic layer-level etching (referred to as atomic layer etching, ALE) characterized by one or more of the following features: (a) An etching gas is supplied to a reaction space through a mass flow controller, together with an inert gas, wherein the etching gas and the inert gas converge downstream of the mass flow controller, and the inert gas is supplied continuously, whereas the etching gas is supplied in pulses, thereby increasing efficiency of purging; (b) a plasma is used for etching, wherein an inert gas or nitrogen gas is supplied as an essential reactant gas to the reaction space for generating a plasma therein, wherein etching rate is controlled by selectively adding an oxidizing gas such as oxygen gas, or reducing gas such as hydrogen gas as an additional reactant gas; (c) the process temperature is controlled at 0° C. to 250° C.; and (d) directionality of etching is controlled to perform either anisotropic or isotropic etching by selecting the type of reactant gas and etching conditions.

In some embodiments, ALE can be performed in a reaction chamber which is also used as a reaction chamber for deposition of film by chemical vapor deposition (CVD), atom layer deposition (ALD), etc., and/or as a reaction chamber for dry etching, wherein no additional chamber is required for performing etching. Alternatively, ALE can be performed in a reaction chamber which is attached to a wafer-handling chamber as one of multiple chambers installed in a cluster apparatus. In some embodiments, ALE is either anisotropic or isotropic ALE performed in the same reaction chamber which is also the same chamber used for $O_2$-ashing, anisotropic etching, etc., in any combination. In some embodiments, ALE is either anisotropic or isotropic ALE performed in one of multiple reaction chambers of a cluster apparatus wherein the other reaction chambers are those for $O_2$-ashing, anisotropic etching, etc., in any combination.

In some embodiments, a plasma for ALE is generated using conductively-coupled electrodes, a remote plasma unit, or a combination of these.

In some embodiments, the etching gas for ALE is at least one gas selected from the group consisting of fluorocarbon, other halogen-containing gas, and hydrocarbon gas.

In some embodiments, the inert gas is continuously supplied as a carrier gas flowing through a carrier gas line, a reactant gas flowing through a reactant gas line, or both carrier gas and reactant gas. Since the inert gas continuously flows, it can function as a purge gas.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

In this disclosure, "gas" may include vaporized solid and/or liquid and may be constituted by a single gas or a mixture of gases. In this disclosure, a process gas introduced to a reaction chamber through a showerhead may be comprised of, consist essentially of, or consist of an etching gas and an additive gas. The additive gas typically includes a reactant gas for reacting with the etching gas when RF power is applied to the reactant gas. The reactant gas may be diluted with a dilution gas which is introduced to the reaction chamber as a mixed gas with the reactant gas or separately from the reactant gas. The etching gas can be introduced with a carrier gas such as a noble gas. Also, a gas other than the process gas, i.e., a gas introduced without passing through the showerhead, may be used for, e.g., sealing the reaction space, which includes a seal gas such as a noble gas. In some embodiments, the term "etching gas" refers generally to at least one gaseous or vaporized compound that participates in etching reaction that etches a layer on a substrate, and particularly to at least one compound that chemisorbs onto the layer in a non-excited state and etches the layer when being activated, whereas the term "reactant gas" refers to at least one gaseous or vaporized compound that contributes to activation of the etching gas or catalyzes an etching reaction by the etching gas. The term "etching gas" refers to an active gas without a carrier gas, or a mixture of an active gas and a carrier gas, depending on the context. Similarly, the term "reactant gas" refers to a reactant gas without a dilution gas, or a reactant gas diluted with a dilution gas, depending on the context. The term "carrier gas" refers to an inert or inactive gas in a non-excited state which carries an etching gas to the reaction space in a mixed state and enters the reaction space as a mixed gas including the etching gas. The inert gas and the etching gas can converge as a mixed gas anywhere upstream of the reaction space, e.g., (a) in an etching gas line upstream of a mass flow controller provided in the etching gas line, wherein the inert gas is provided as a carrier gas or purge gas flowing through the etching gas line, (b) in an etching gas line downstream of a mass flow controller provided in the etching gas line but upstream of a gas manifold where all or main process gases converge, wherein the inert gas is provided as a part of the etching gas (as a carrier gas or purge gas), and/or (c) in a gas manifold where all or main process gases converge, wherein the inert gas flows in a reactant gas line as a reactant gas or purge gas upstream of the gas manifold. In the above, typically, (a) is rare. Thus, the inert gas can serve as a carrier gas (as a part of etching gas) and/or at least a part of a reactant gas, wherein the above gases can serve also as purge gases.

In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers.

Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Additionally, the terms "constituted by" and "having" refer independently to "typically or broadly comprising", "comprising", "consisting essentially of", or "consisting of" in some embodiments. Further, an article "a" or "an" refers to a species or a genus including multiple species. In this disclosure, any defined meanings do not necessarily exclude ordinary and customary meanings in some embodiments.

In the present disclosure where conditions and/or structures are not specified, the skilled artisan in the art can readily provide such conditions and/or structures, in view of the present disclosure, as a matter of routine experimentation. In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

The embodiments will be explained with respect to preferred embodiments. However, the present invention is not limited to the preferred embodiments.

Some embodiments which resolve at least one of the problems discussed earlier provide a method for etching a layer on a substrate placed between electrodes in a reaction space by an atomic layer etching (ALE) process which comprises at least one etching cycle, wherein an etching cycle comprises: (i) continuously providing an inert gas flowing at least as a carrier gas for an etching gas into the reaction space; (ii) providing a pulse of an etching gas into the continuous inert gas flow upstream of the reaction space to chemisorb the etching gas in an unexcited state on a surface of the substrate in the reaction space; and (iii) providing a pulse of RF power discharge between the electrodes to generate a reactive species of the inert gas in the reaction space and to contact the etching gas-chemisorbed surface of the substrate with the reactive species so that the layer on the substrate is etched. In the above, the term "continuously" refers to without interruption in space (e.g., uninterrupted supply over the substrate), without interruption in flow (e.g., uninterrupted inflow), and/ or at a constant rate (the term need not satisfy all of the foregoing simultaneously), depending on the embodiment. In some embodiments, "continuous" flow has a constant flow rate (alternatively, even through the flow is "continuous", its flow rate may be changed with time). In this disclosure, "chemisorption" refers to chemical saturation adsorption. Since chemisorption is a self-limiting adsorption reaction process, the amount of deposited etching gas molecules is determined by the number of reactive surface sites and is independent of the precursor exposure after saturation, and a supply of the etching gas is such that the reactive surface sites are saturated thereby per cycle.

In some embodiments, the carrier gas serves also as a reactant gas (e.g., the inert gas used for ALE consists of the carrier gas). In some embodiments, the method further comprises providing a reactant gas separately from the carrier gas into the reaction space, and in some embodiments, the reactant gas includes an inert gas continuously flowing in the reaction space continuously during the ALE process.

In some embodiments, the pulse of the etching gas and the pulse of RF power discharge do not overlap. In some embodiments, a purging period is taken between the pulse of the etching gas and the pulse of RF power discharge to remove excess etching gas from the reaction space, and a purging period is taken after the pulse of RF power discharge to remove reaction products from the reaction space.

In some embodiments, the etching cycle is repeated multiple times (e.g., 50 times to 5,000 times, typically 200 times to 2,000 times), depending on the target thickness to be etched, wherein the layer is etched to the degree that the etching gas chemisorbed as an atomic layer on a surface of the layer can etch per ALE cycle. In some embodiments, when the layer of the substrate is a silicon-containing dielectric layer such as silicon oxide film, the etching rate per cycle (EPC) is at least 0.003 nm/cycle (typically 0.005 nm to 0.05 nm/cycle), and the etching rate per minute is at least 0.10 nm/min (typically 0.15 nm/min to 1.5 nm/min), as measured when a top layer or blanket layer is etched.

In some embodiments, the etching gas is at least one halogen-containing gas such as $C_2F_6$, $C_4F_8$, $C_3F_8$, $C_5F_8$, and/or at least one hydrocarbon gas such as hexane In some embodiments, no gas other than a halogen-containing gas flows as the etching gas throughout the ALE process.

In some embodiments, the inert gas flows as a carrier gas in the reaction space continuously during the ALE process. Alternatively or additionally, the inert gas flows as a reactant gas in the reaction space continuously during the ALE process. If the inert gas constitutes and serves also as a carrier gas, and the reactant gas includes an inert gas, the inert gas of the reactant gas can flow in the reaction space in pulses. A reactant gas other than the inert gas may flow in the reaction space in pulses. The carrier gas, reactant gas, or any other continuously flowing gas which is mixed with the etching gas upstream of the reaction space (e.g., upstream of a showerhead or a gas manifold where multiple gases converge disposed upstream of the showerhead) may be referred to broadly as a carrier gas since the gas enters into the reaction space together with the etching gas in a mixed state, and also as a purge gas since the continuous flow can purge unwanted etching gas and reaction product from the reaction space and the substrate surface.

In some embodiments, the inert gas is selected from the group consisting of a noble gas (such as He, Ne, Ar, Kr, and/or Xe, preferably Ar and/or He), nitrogen gas, or a combination of a noble gas and nitrogen gas.

In some embodiments, the reactant gas consists of the inert gas or the inert gas and at least one additional gas which is selected from the group consisting of oxidizing gas (e.g., $O_2$ gas) and reducing gas (e.g., $H_2$ gas). In some embodiments, the inert gas used for ALE consists of a carrier gas flowing through a carrier gas line, or consists of a carrier gas continuously flowing through a carrier gas line and at least part of a reactant gas continuously flowing through a reactant gas line separated from the carrier gas line.

In some embodiments, the layer of the substrate has a recess pattern. As with atomic layer deposition (ALD), conformality or directionality of etching is very high generally in the ALE process. However, in some embodiments, the layer of the substrate is etched anisotropically, by supplying the inert gas to the reaction space at a flow rate of more than 1,000 sccm (e.g., 2,000 sccm, 3,000 sccm, 4,000 sccm, 5,000 sccm, 6,000 sccm, 7,000 sccm, or any values therebetween) wherein the flow rate of carrier gas is more than 500 sccm (e.g., 1,000 sccm, 1,500 sccm, 2,000 sccm, or any values therebetween) under conditions using certain RF power, pressure, etc. The etching is "anisotropic" when conformality of etched surfaces which is a percentage calculated by dividing the etched thickness at a sidewall by the etched thickness at a top surface is 30% or less. If the conformality is 20% or less, 10% or less, or 5% or less, the etching is highly anisotropic. In some embodiments, conformality or directionality of etching can be adjusted by including nitrogen-containing gas, oxidizing gas, and/or reducing gas in the reactant gas. In some embodiments, the ALE process is conducted at a temperature of 0° C. to 200° C., preferably about 50° C. to about 100° C.

In some embodiments, the reaction space is formed in a reaction chamber for film-forming or dry-etching. The ALE process can be conducted using the same reaction chamber used for film-forming or dry-etching so that fabrication of a device can continuously and efficiently be performed. Alternatively, the ALE process can be conducted in a chamber attached to a common wafer-handling chamber of a cluster apparatus.

The dielectric film to be etched includes, but is not limited to, a low-k film made of: silicon-containing insulation film constituted by SiO, SiC, SiCN, SiN, or the like; metal-containing oxide film constituted by Al, Ti, or the like; nitride film; or metal film. In some embodiments, the dielectric film is formed in trenches or vias including side walls and bottom surfaces, and/or flat surfaces, by plasma-enhanced CVD, thermal CVD, cyclic CVD, plasma-enhanced ALD, thermal ALD, radical-enhanced ALD, or any other thin film deposition method. Typically, the thickness of the dielectric film is in a range of about 50 nm to about 500 nm (a desired film thickness can be selected as deemed appropriate according to the application and purpose of film, etc.). The dielectric film may be used for double-patterning.

Figure 1:
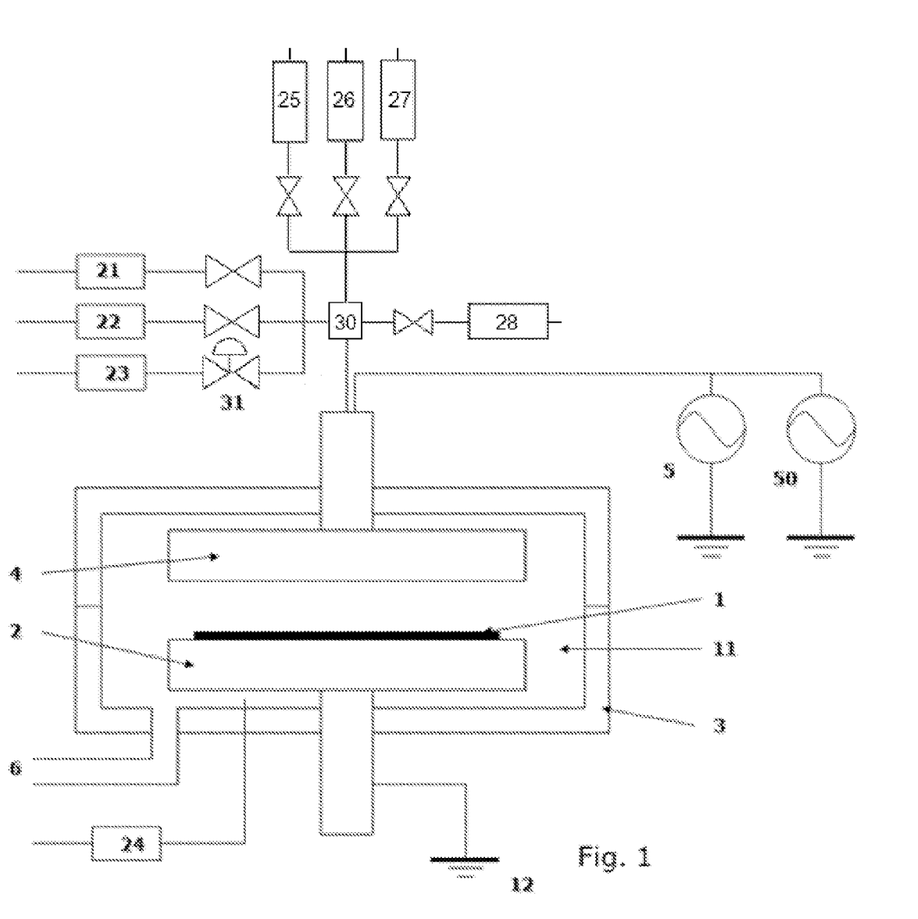
FIG. 1 is a schematic representation of a PEALE (plasma-enhanced atomic layer etching) apparatus for etching a semiconductor substrate usable in an embodiment of the present invention.

FIG. 1 is a schematic view of a PEALE apparatus, desirably in conjunction with controls programmed to conduct the sequences described below, usable in some embodiments of the present invention. This apparatus can also be used for film deposition by ALD or CVD. In this figure, by providing a pair of electrically conductive flat-plate electrodes 4, 2 in parallel and facing each other in the interior 11 of a reaction chamber 3, applying HRF power (13.56 MHz or 27 MHz) 5 and LRF power of 5 MHz or less (400 kHz-500 kHz) 50 to one side, and electrically grounding 12 to the other side, a plasma is excited between the electrodes. A temperature regulator is provided in a lower stage 2 (the lower electrode), and a temperature of a substrate 1 placed thereon is kept constant at a given temperature. The lower electrode 2 serves as a susceptor, and the upper electrode 4 serves as a shower plate as well, which is made to supply gases uniformly over the entire surface of the substrate 1 placed on the susceptor 2.

An etching gas and purge gas are introduced into the reaction chamber 3 through a mass flow controller 23, a pulse flow control valve 31, a gas manifold 30, and the shower plate 4. A gas line on which the mass flow controller 23 is provided is an etching gas line, a gas line on which a mass flow controller 21 is provided is a nitrogen gas line, and a gas line on which a mass flow controller 22 is provided is a noble gas line, wherein the etching gas line, the nitrogen gas line, and the noble gas line may also be referred to collectively as etching gas lines. A noble gas flows through the noble gas line with the mass flow controller 22 and serves as an inert carrier gas which is mixed with the etching gas downstream of the mass flow controller 23 but upstream of the gas manifold 30. Alternatively or additionally, a nitrogen gas flows through the nitrogen gas line with the mass flow controller 21 and is added to the etching gas as an inert carrier gas. A reactant gas is constituted by a nitrogen gas which flows through a nitrogen gas line on which a mass flow controller 25 is provided, a noble gas which flows through a noble gas line on which a mass flow controller 26 is provided, an oxidizing gas which flows through an oxidizing gas line on which a mass flow controller 27 is provided, and/or a hydrogen gas which flows through a hydrogen gas line on which a mass flow controller 28 is provided, wherein the nitrogen gas line, the noble gas line, the oxidizing gas line, and the hydrogen gas line may also be referred to collectively as reactant gas lines. The noble gas which flows through the noble gas line on which the mass flow controller 26 is provided, and/or the nitrogen gas which flows through the nitrogen gas line on which the mass flow controller 25 is provided, serve(s) as an inert reactant gas which is mixed with the etching gas at the gas manifold 30 upstream of the shower plate 4. Since the above-described inert gases flow continuously into the reaction space, they also can function as a purge gas. As the continuous inert gas flow, the inert carrier gas flow is more effective than the inert reactant gas flow, and thus, in some embodiments, the inert reactant gas flow can be eliminated.

Additionally, in the reaction chamber 3, an exhaust pipe 6 is provided, through which gas in the interior 11 of the reaction chamber 3 is exhausted. Additionally, the reaction chamber 3 is provided with a seal gas flow controller 24 to introduce seal gas into the interior 11 of the reaction chamber 3 (a separation plate for separating a reaction zone and a transfer zone in the interior of the reaction chamber is omitted from this figure).

A skilled artisan will appreciate that the apparatus includes one or more controller(s) (not shown) programmed or otherwise configured to cause the deposition and etching processes described elsewhere herein to be conducted. The controller(s) are communicated with the various power sources, heating systems, pumps, robotics and gas flow controllers or valves of the reactor, as will be appreciated by the skilled artisan.

Figure 2:
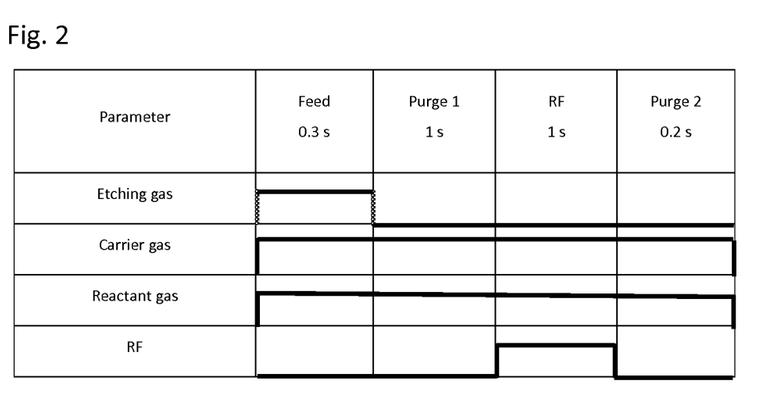
FIG. 2 shows a schematic process sequence of PEALE in one cycle according to an embodiment of the present invention wherein a step illustrated in a column represents an ON state whereas no step illustrated in a column represents an OFF state, and the width of each column does not represent duration of each process.

In some embodiments, the process sequence may be set as illustrated in FIG. 2. FIG. 2 shows a schematic process sequence of PEALE in one cycle according to an embodiment of the present invention wherein a step illustrated in a column represents an ON state whereas no step illustrated in a column represents an OFF state, and the width of each column does not represent duration of each process. In this embodiment, one cycle of PEALE consists of "Feed" where an etching gas is fed to a reaction space via a carrier gas which carries the etching gas without applying RF power to the reaction space, and also, a reactant gas is fed to the reaction space, thereby chemisorbing the etching gas onto a surface of a substrate via self-limiting adsorption; "Purge 1" where no etching gas is fed to the reaction space, while the carrier gas and reactant gas are continuously fed to the reaction space, without applying RF power, thereby removing non-chemisorbed etching gas and excess gas from the surface of the substrate; "RF" where RF power is applied to the reaction space while the carrier gas and reactant gas are continuously fed to the reaction space, without feeding the etching gas, thereby etching a layer on which the etching gas is chemisorbed through plasma reaction with the reactant gas; and "Purge 2" where the carrier gas and reactant gas are continuously fed to the reaction space, without feeding the etching gas and without applying RF power to the reaction space, thereby removing reaction products and excess gas from the surface of the substrate. The carrier gas can be constituted by the reactant gas. Due to the continuous flow of the carrier gas entering into the reaction space as a constant stream into which the etching gas is injected intermittently or in pulses, purging can be conducted efficiently to remove excess gas and reaction products quickly from the surface of the layer, thereby efficiently continuing multiple ALE cycles. Incidentally, in this embodiment, the durations of the Feed step, the Purge 1 step, the RF step, and the Purge 2 step are 0.3 seconds, one second, one second, and 0.2 seconds, and thus, the total duration of one cycle is 2.5 seconds.

Figure 3:
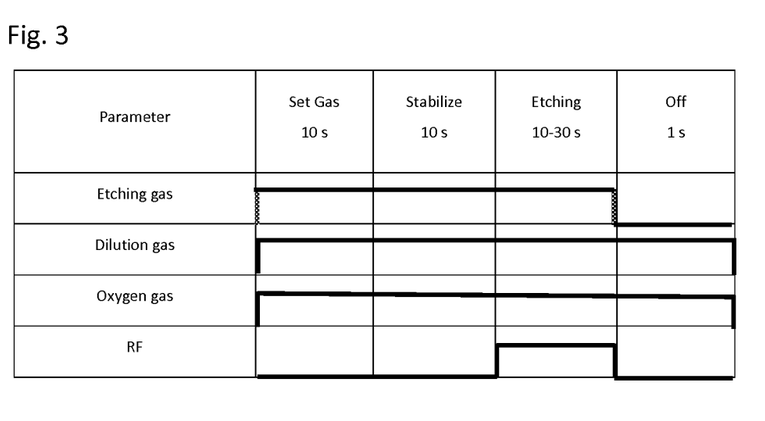
FIG. 3 shows a schematic process sequence of non-cyclic etching process according to a comparative embodiment wherein a step illustrated in a column represents an ON state whereas no step illustrated in a column represents an OFF state, and the width of each column does not represent duration of each process.

FIG. 3 shows a schematic process sequence of non-cyclic etching process according to a comparative embodiment wherein a step illustrated in a column represents an ON state whereas no step illustrated in a column represents an OFF state, and the width of each column does not represent duration of each process. In this comparative embodiment, the non-cyclic etching process consists of "Set Gas", "Stabilize", "Etching", and "Off". The sequence illustrated in FIG. 3 is not atomic layer etching. That is, etching is conducted using active species which are generated in a reaction space before reaching a surface of the layer and then reach the surface of the layer, thereby etching the surface. Thus, in the Etching step, the etching gas is fed while RF power is applied, and non-cyclic etching is conducted wherein the duration of the Etching step is long (e.g., 10 to 30 seconds) as compared with the ALE process. Although the etching rate of the non-cyclic etching process is very high, since the active species fall down on the surface of the layer, side walls of recesses of a pattern formed on the substrate are not significantly etched, i.e., etching is typically anisotropic, and it is difficult to form fine, narrow patterns.

In some embodiments, PEALE may be conducted under conditions shown in Table 1 below.

TABLE 1

Conditions for PEALE

| | |
|---|---|
| Substrate temperature | 0 to 250 ° C. (preferably 50 to 100° C.) |
| Pressure | 133.3 to 800 Pa (preferably 200 to 400 Pa); 300 to 800 Pa (preferably 400 to 800 Pa) for anisotropic etching |
| Inert gas (as a carrier gas and/or reactant gas) | Ar, He, $N_2$ |
| Total flow rate of inert gas (continuous) | 300 to 2000 sccm (preferably 500 to 1000 sccm); 1000 to 7000 sccm (preferably 3000 to 6000 sccm) for anisotropic etching |
| Flow rate of carrier gas (continuous) | 300 to 1500 sccm (preferably 500 to 1000 sccm); 500 to 2000 sccm (preferably 1000 to 2000 sccm) for anisotropic etching |
| Auxiliary reactant gas | $O_2$, $H_2$ |
| Flow rate of auxiliary reactant gas (continuous) | 100 to 5000 sccm (preferably 500 to 2000 sccm) |
| Etching gas | $C_2F_6$, $C_4F_8$ |
| Flow rate of etching gas (not including carrier gas) | 5 to 1000 sccm (preferably 10 to 300 sccm) |
| RF power (13.56 MHz) for a 300-mm wafer | 50 to 300 W (preferably 100 to 250 W); 250 to 800 W (preferably 400 to 700 W) for anisotropic etching |
| Duration of "Feed" | 0.1 to 5 sec. (preferably 0.1 to 1 sec.) |
| Duration of "Purge 1" | 0.2 to 20 sec. (preferably 1 to 6 sec.) |
| Duration of "RF" | 0.2 to 10 sec. (preferably 0.5 to 2 sec.) |
| Duration of "Purge 2" | 0.1 to 5 sec. (preferably 0.1 to 1 sec.) |
| EPC (nm/cycle) | 0.001 to 0.2 (preferably 0.005 to 0.1) on top surface |
| Etching rate (nm/min) | 0.001 to 2 (preferably 0.04 to 1) on top surface |

(the numbers are approximate)

In the ALE process, the etching rate is low since etching takes place using one etching gas layer at a time, and conformality is generally high since the etching gas is chemisorbed non-directionally in general. However, by (i) supplying particularly a noble gas as the inert gas, rather than nitrogen gas, to the reaction space (ii) at an increased flow rate (e.g., 3,000 sccm or higher wherein the flow rate of carrier gas is more than 500 sccm) under conditions with (iii) a certain RF power (e.g., 250 W or higher), and (iv) a certain pressure (e.g., 300 Pa or higher), wherein condition (i) and at least one of conditions (ii) to (iv) are employed, the layer of the substrate can effectively be etched anisotropically. It is surprising that changing from conformal etching to anisotropic etching occurs in a critical manner under the above described conditions. Without being limited by theory, under the described conditions, a plasma is enhanced and excited species travel long distance, thereby increasing the reactivity on a horizontal surface rather than sidewalls in recesses and effectively performing anisotropic etching.

The present invention is further explained with reference to working examples below. However, the examples are not intended to limit the present invention. In the examples where conditions and/or structures are not specified, the skilled artisan in the art can readily provide such conditions and/or structures, in view of the present disclosure, as a matter of routine experimentation. Also, the numbers applied in the specific examples can be modified by a range of at least ±50% in some embodiments, and the numbers are approximate.

EXAMPLES

Examples 1-12 and Comparative Examples 1-3

A silicon oxide film was formed by PEALD on a 300-mm substrate having a patterned surface having an aspect ratio of about 2 and an opening width of about 50 nm. In Examples 1-12 and Comparative Example 3, PEALE was conducted using $C_2F_6$ or $C_4F_8$ as an etching gas on the silicon oxide film under the conditions shown in Table 2 below using the PEALE apparatus illustrated in FIG. 1. The sequence used in each cycle of PEALE is shown in FIG. 2 and Table 3 below. Ar gas was fed only as a carrier gas flowing through the mass flow controller 22 of the etching gas lines and served also as a reactant gas. Nitrogen gas, oxygen gas, and hydrogen gas were fed as reactant gases flowing through the mass flow controllers 25, 27, and 28 of the reactant gas lines, respectively, wherein nitrogen gas was fed as a carrier gas.

TABLE 2

| Ex | Etching gas | Etching gas flow rate (sccm) | Ar (slm) | $N_2$ (slm) | $O_2$ (slm) | $H_2$ (slm) | RF (W) | Pressure (Pa) | Temp (°C.) |
|---|---|---|---|---|---|---|---|---|---|
| Com. 1 | $C_2F_6$ | 600 | 2 | — | 1 | — | 200 | 266 | 400 |
| Com. 2 | $C_2F_6$ | 600 | 2 | — | 1 | — | 200 | 533 | 400 |
| Com. 3 | $C_2F_6$ | 30 | 1 | — | 1 | — | 200 | 200 | 260 |
| Ex 1 | $C_2F_6$ | 30 | 1 | — | — | — | 200 | 200 | 50 |
| Ex 2 | $C_2F_6$ | 30 | 1 | — | 1 | — | 200 | 200 | 50 |
| Ex 3 | $C_2F_6$ | 30 | — | 1 | — | 0.2 | 200 | 200 | 50 |
| Ex 4 | $C_2F_6$ | 30 | 1 | — | — | 0.2 | 200 | 200 | 50 |
| Ex 5 | $C_2F_6$ | 30 | — | 1 | — | — | 200 | 200 | 50 |
| Ex 6 | $C_2F_6$ | 30 | 1 | — | 1 | — | 200 | 200 | 100 |
| Ex 7 | $C_2F_6$ | 30 | 1 | — | 1 | — | 200 | 200 | 200 |
| Ex 8 | $C_2F_6$ | 30 | 1 | — | 1 | — | 200 | 200 | 250 |
| Ex 9 | $C_2F_6$ | 30 | — | 1 | — | — | 200 | 200 | 100 |
| Ex 10 | $C_2F_6$ | 30 | — | 1 | — | — | 200 | 200 | 200 |
| Ex 11 | $C_2F_6$ | 30 | 6 | — | — | — | 600 | 600 | 100 |
| Ex 12 | $C_4F_8$ | 50 | 2 | — | — | — | 200 | 200 | 100 |
| Ex. 13 | $C_2F_6$ | 30 | 1 | — | — | — | 300 | 200 | 50 |
| Ex. 14 | $C_2F_6$ | 30 | 1 | — | — | — | 200 | 500 | 50 |
| Ex. 15 | $C_2F_6$ | 30 | 2 | — | — | — | 300 | 400 | 50 |

TABLE 3

| Conditions for PEALE | |
|---|---|
| Duration of "Feed" | 0.3 sec. |
| Duration of "Purge 1" | 5 sec. (Ex 12 = 2 sec.) |
| Duration of "RF" | 1 sec. |
| Duration of "Purge 2" | 0.2 sec. |
| Number of cycles repeated (Etching 10 nm was the target) | Ex 1 = 250; Ex 2 = 500; Ex 3 = 500; Ex 4 = 500; Ex 5 = 334; Ex 6 = 334; Ex 7 = 500; Ex 8 = 1000; Ex 9 = 334; Ex 10 = 2000; Ex 11 = 334; Ex 12 = 200; Ex 13 = 500; Ex 14 = 334; Ex 15 = 500 |

In Comparative Examples 1 and 2, non-cyclic etching was conducted on the silicon oxide film under the conditions shown below using the PEALE apparatus illustrated in FIG. 1. The sequence used in the non-cyclic etching is shown in FIG. 3 and Table 4 below.

TABLE 4

| Conditions for non-cyclic etching | |
|---|---|
| Duration of "Set Gas" | 10 sec. |
| Duration of "Stabilize" | 10 sec. |
| Duration of "Etching" | 10~30 sec. |
| Duration of "Off" | 1 sec. |

The results are shown in Table 5 below. The conformality of etched surfaces is a percentage calculated by dividing the etched thickness at a sidewall or bottom by the etched thickness at a top surface.

TABLE 5

| Ex | Etching rate (EPC) (nm/cycle) | Etching rate (nm/min) | Conformality of etched surfaces Sidewall/Bottom (%) | Remarks |
|---|---|---|---|---|
| Com. 1 | — | 51 | 0/75 | |
| Com. 2 | — | 80 | 0/69 | |

TABLE 5-continued

| Ex | Etching rate (EPC) (nm/cycle) | Etching rate (nm/min) | Conformality of etched surfaces Sidewall/Bottom (%) | Remarks |
|---|---|---|---|---|
| Com. 3 | 0 | — | — | No ALE |
| Ex. 1 | 0.04 | 0.33 | 80/95 | |
| Ex. 2 | 0.02 | 0.16 | 82/95 | |
| Ex. 3 | 0.02 | 0.16 | 81/92 | |
| Ex. 4 | 0.02 | 0.16 | 105/115 | |
| Ex. 5 | 0.03 | 0.25 | 82/92 | |
| Ex. 6 | 0.03 | 0.25 | 80/82 | |
| Ex. 7 | 0.02 | 0.16 | 86/82 | |
| Ex. 8 | 0.01 | 0.08 | 83/82 | |
| Ex. 9 | 0.03 | 0.25 | 105/115 | |
| Ex. 10 | 0.005 | 0.04 | 100/119 | |
| Ex. 11 | 0.03 | 0.25 | 3/120 | Anisotropic ALE |
| Ex. 12 | 0.05 | 0.69 | 94/90 | |
| Ex. 13 | 0.02 | 0.16 | 9/98 | Anisotropic ALE |
| Ex. 14 | 0.03 | 0.16 | 8/95 | Anisotropic ALE |
| Ex. 15 | 0.02 | 0.16 | 10/105 | Anisotropic ALE |

As shown in Table 5, when Ar was used as a carrier gas and a reactant gas without other gases (Examples 1, 11, and 12), the etching rate was the highest (EPC=0.04, 0.03, and 0.05, respectively), and when N₂ was used as a carrier gas and a reactant gas without other gases (Examples 5 and 9), the etching rate was higher (EPC=0.03 and 0.03, respectively) than when other gases were used as a reactant gas. When $O_2$ or $H_2$ was added to the carrier gas (Example 2, 3, and 4), the etching rate was lowered (EPC=0.02); however, when $H_2$ was added to the carrier gas which was Ar (Example 4), the etching conformality was changed to etch the layer more at the bottom and sidewall (Conformality=105/115). A similar phenomenon was observed when N₂ was used as a carrier gas without other gases at a temperature of 100° C. and 200° C. (Examples 9 and 10) (Conformality=105/115 and 100/119, respectively).

The etching temperature greatly affected etching rate. When the temperature was 50° C. (Examples 2), 100° C. (Example 6), 200° C. (Example 7), and 250° C. (Example 8) when the carrier gas was Ar and the reactant gas was 02, the etching rates (EPC) were 0.02, 0.03, 0.02, and 0.01, respectively, indicating that when the temperature was 250° C., the etching rate was significantly lowered. Further, when the temperature was 260° (Comparative Example 3), ALE did not occur, i.e., the etching rate was zero. Similarly, when the temperature was 50° C. (Examples 5), 100° C. (Example 9), and 200° C. (Example 10) when the carrier gas was N₂ without other gases, the etching rates (EPC) were 0.03, 0.03, and 0.005, respectively, indicating that when the temperature was 200° C., the etching rate was significantly lowered. When the etching temperature is high, adsorption of etching gas would not sufficiently advance, and when the temperature exceeds 250° C., no ALE process may be performed.

When non-cyclic etching was conducted (Comparative Examples 1 and 2), the etching conformality was zero, indicating that the etching was clearly anisotropic. Further, since etching was not performed cyclically, it would be very difficult to conduct fine tuning of etching thickness. In contrast, the ALE process generally performs conformal etching (isotropic etching; conformality is no less than 80%) and can achieve fine tuning of etching thickness, indicating that the ALE process is suitable for forming micro-patterns with high precision. However, although the ALE process was performed, the etching conformality can be adjusted by using certain conditions, and when the carrier gas was fed at a high flow rate (6 slm in Example 11), when an RF power was high (500 W in Example 13), when a pressure was high (500 Pa in Example 14), and when both an RF power and a pressure were high (500 W and 400 Pa in Example 15), anisotropic etching was highly effectively performed (Conformality: 3/120 in Example 11, 9/98 in Example 13, 8/95 in Example 14, and 10/105 in Example 15).

Example 13

Figure 4:
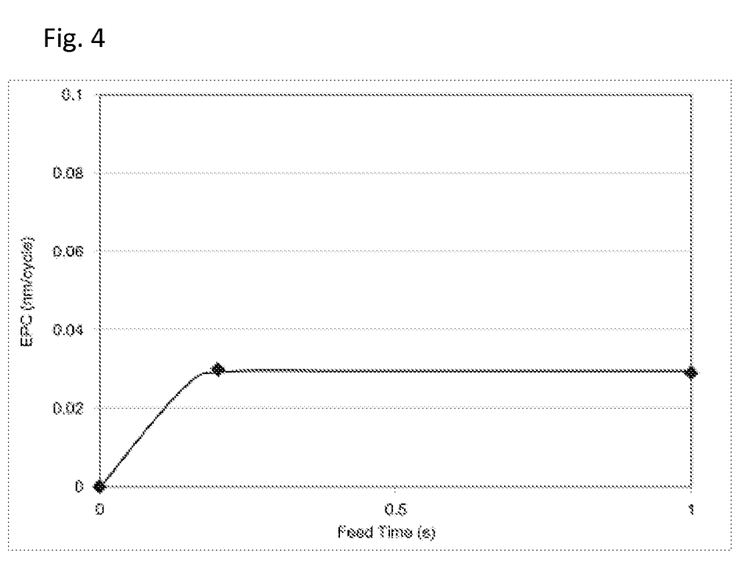
FIG. 4 is a graph showing the relationship between etching rate per cycle (EPC) (nm/cycle) and etching gas feed time per cycle (seconds) according to an embodiment of the present invention.

The ALE process was performed according to Example 5 above, except that the feed time of etching gas was changed. FIG. 4 is a graph showing the relationship between etching rate per cycle (EPC) (nm/cycle) and etching gas feed time per cycle (seconds). As shown in FIG. 4, after the feed time reached 0.2 seconds, EPC was unchanged, indicating that self-limiting adsorption reaction process was conducted.

Example 14

Figure 5:
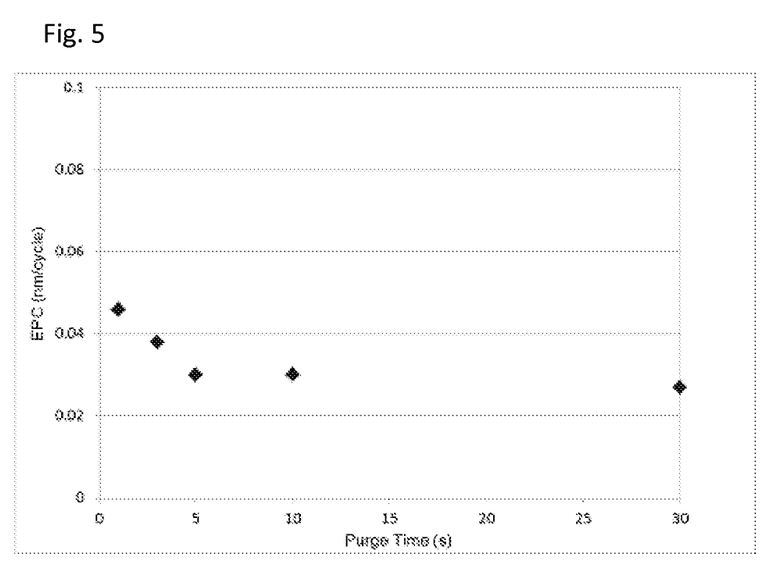
FIG. 5 is a graph showing the relationship between etching rate per cycle (EPC) (nm/cycle) and purge time per cycle (seconds) according to an embodiment of the present invention.

The ALE process was performed according to Example 5 above, except that the purge time upon feeding of the etching gas was changed. FIG. 5 is a graph showing the relationship between etching rate per cycle (EPC) (nm/cycle) and purge time per cycle (seconds). As shown in FIG. 5, after the purge time reached 0.5 seconds, EPC was unchanged, indicating chemisorption of the etching gas was conducted.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A method for etching a layer on a substrate placed between electrodes in a reaction space by an atomic layer etching (ALE) process which comprises at least one etching cycle, wherein an etching cycle comprises:
   continuously providing an inert gas flowing at least as a carrier gas for an etching gas into the reaction space, wherein the carrier gas flows through a mass flow controller and then through a gas manifold disposed upstream of the reaction space, said inert gas referring to a gas that does not etch the substrate in an unexcited state;
   providing a pulse of an etching gas into the continuous inert gas flow upstream of the reaction space to chemisorb the etching gas in an unexcited state on a surface of the substrate in the reaction space, wherein the etching gas flows through a mass flow controller and is converged into the carrier gas flow downstream of the mass flow controller for the carrier gas and upstream of the gas manifold;
   continuously providing a reactant gas other than the carrier gas and the etching gas into the reaction space, wherein each reaction gas flows through a mass flow controller and is then converged into the etching gas with the carrier gas at the gas manifold; and
   providing a pulse of RF power discharge between the electrodes to generate a reactive species of the inert gas in the reaction space and to contact the etching gas-chemisorbed surface of the substrate with the reactive species so that the layer on the substrate is etched.

2. The method according to claim 1, wherein the etching gas is a halogen-containing gas and/or hydrocarbon gas.

3. The method according to claim 1, wherein the carrier gas functions also as a reactant gas.

4. The method according to claim 1, wherein the inert gas is selected from the group consisting of a noble gas and nitrogen gas.

5. The method according to claim 1, wherein the reactant gas includes at least one gas which is selected from the group consisting of a noble gas, nitrogen gas, oxidizing gas, and reducing gas.

6. The method according to claim 1, wherein the reactant gas includes at least one gas which is selected from the group consisting of oxidizing gas and reducing gas.

7. The method according to claim 1, wherein the ALE process is conducted at a temperature of 0° C. to 200° C.

8. The method according to claim 1, wherein the pulse of the etching gas and the pulse of RF power discharge do not overlap.

9. The method according to claim 7, wherein a purging period is taken between the pulse of the etching gas and the pulse of RF power discharge to remove excess etching gas from the reaction space, and a purging period is taken after the pulse of RF power discharge to remove reaction products from the reaction space.

10. The method according to claim 1, wherein no gas other than a halogen-containing gas flows as the etching gas throughout the ALE process.

11. The method according to claim 1, wherein the layer of the substrate has a recess pattern.

12. The method according to claim 11, wherein at least one of the following conditions is employed during the ALE process: (i) a flow rate of the inert gas is 3,000 sccm or higher, (ii) an RF power is 250 W or higher, and (iii) a pressure is 300 Pa or higher.

13. The method according to claim 1, wherein the inert gas is a noble gas, and the layer of the substrate is etched anisotropically by supplying the inert gas to the reaction space.

14. The method according to claim 1, wherein the etching cycle is repeated multiple times.

15. The method according to claim 1, wherein the reaction space is formed in a reaction chamber for film-forming or dry-etching.

16. The method according to claim 1, wherein the layer of the substrate is a silicon-containing dielectric layer, and an etching rate is at least 0.015 nm/min.

* * * * *